United States Patent [19]

Divjak

[11] Patent Number: 5,416,364

[45] Date of Patent: May 16, 1995

[54] DIRECT CURRENT TO DIRECT CURRENT GALVANIC ISOLATOR

[75] Inventor: August A. Divjak, Waukesha, Wis.

[73] Assignee: Johnson Service Company, Milwaukee, Wis.

[21] Appl. No.: 91,315

[22] Filed: Jul. 14, 1993

[51] Int. Cl.⁶ ............................................. H02M 3/22
[52] U.S. Cl. ..................................... 327/535; 363/65; 327/104; 327/190; 327/594
[58] Field of Search ............ 307/282, 281, 309, 317.1, 307/296.1, 296.4, 296.6, 261, 603; 363/71, 20, 21, 65; 331/57, 113 R

[56] References Cited

U.S. PATENT DOCUMENTS 3,852,655 12/1974 Justice ..................................... 363/71
5,142,468 8/1992 Nerem ..................................... 363/71

FOREIGN PATENT DOCUMENTS 0144923 11/1979 Japan ..................................... 363/21

Primary Examiner—Timothy P. Callahan
Assistant Examiner—Dinh Le
Attorney, Agent, or Firm—Foley & Lardner

[57] ABSTRACT

A signal isolation apparatus has a first transformer with a primary winding tap receiving an input signal and another primary winding tap receiving a first oscillating signal. A second transformer has a primary winding tap receiving the input signal and another primary winding tap receiving a second oscillating signal. The second oscillating signal is out of phase (typically 180 degrees out of phase) with the first oscillating signal. A rectifier electrically connected between a first secondary winding tap of the first transformer and a first secondary winding tap of the second transformer has a high output terminal and a low output terminal, the low output terminal being referenced to a second secondary winding of the first and second transformers. A signal across the high and low output terminals is an output signal galvanically isolated from the input signal with the same electrical characteristics as the input signal. Because a highly accurate reproduction of the input is achieved, the input can be a constant DC power level or a DC level which varies thereby forming an information carrying signal on the power line.

17 Claims, 4 Drawing Sheets

DIRECT CURRENT TO DIRECT CURRENT GALVANIC ISOLATOR

BACKGROUND OF THE INVENTION

1. Field of the Invention

This invention relates generally to the field of signal isolation, and in particular, to the isolation of DC power and signals carrying information on DC power lines. A circuit according to the invention reproduces an isolated signal with a high degree of accuracy without the need for complex circuitry.

2. Related Art

Currently available methods for isolating DC signals are complex and costly. Moreover, DC power and information carrying signals are generally transmitted and isolated separately. For example, for isolating DC power lines, separate transformers or a winding on a transformer can be used for the various DC power sources. Alternatively, commercially available DC/DC converters are employed. Such DC/DC converters usually have internal high frequency oscillators, current buffers, rectification circuits, filters and other circuitry which make the devices inefficient and physically large and expensive.

Information carrying signals are separately transmitted and are typically isolated using optical isolators. Digital signals from such optical isolators must then be converted to analog signals. This also increases the circuit complexity and the cost of producing such circuits.

SUMMARY OF THE INVENTION

In view of the limitations of the present systems, it is an object of the present invention to provide a circuit for isolating DC power lines and DC power lines with information carrying signals thereon, which circuit may be self biasing.

It is still another object of the invention to provide a circuit which can be used for isolating DC levels associated both with power sources and information carrying signals transmitted on the power lines.

Other objects and advantages of the invention will become more apparent hereinafter as the invention is described in the specifications and drawings.

The above and other objects of the invention are accomplished by a signal isolation apparatus which has a first transformer having a primary winding tap receiving an input signal and another primary winding tap receiving a first oscillating signal. A second transformer has a primary winding tap receiving the input signal and another primary winding tap receiving a second oscillating signal. The second oscillating signal is out of phase (typically 180 degrees out of phase) with the first oscillating signal and may be produced by a separate oscillator or by a phase shifting circuit receiving the first oscillating signal. The oscillating signals typically vary between a supply voltage and one volt. A rectifier is electrically connected between a first secondary winding tap of the first transformer and a first secondary winding tap of the second transformer. The rectifier has a high output terminal and a low output terminal, the low output terminal being referenced to a second secondary winding of the first and second transformers. A signal across the high and low output terminals is an output signal galvanically isolated from the input signal with the same electrical characteristics as the input signal. Because a highly accurate reproduction of the input is achieved, the input can be a constant DC power level or a DC level which varies thereby forming an information carrying signal on the power line.

BRIEF DESCRIPTION OF THE DRAWINGS

The invention herein is described with particularity with reference to the drawings in which.

DETAILED DESCRIPTION OF THE PREFERRED EMBODIMENTS

Figure 1:
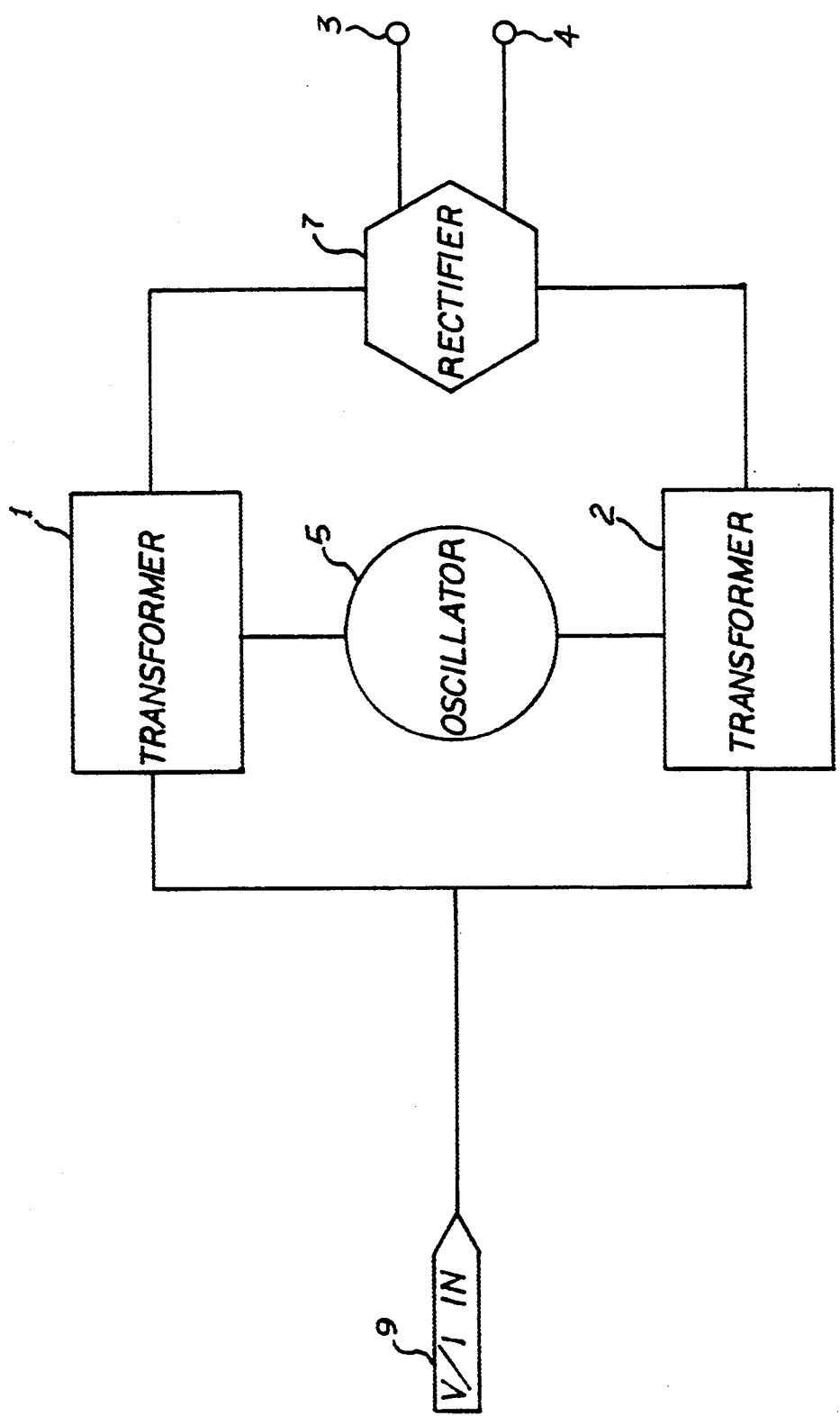
FIG. 1 is a block diagram of the present invention.
Figure 3:
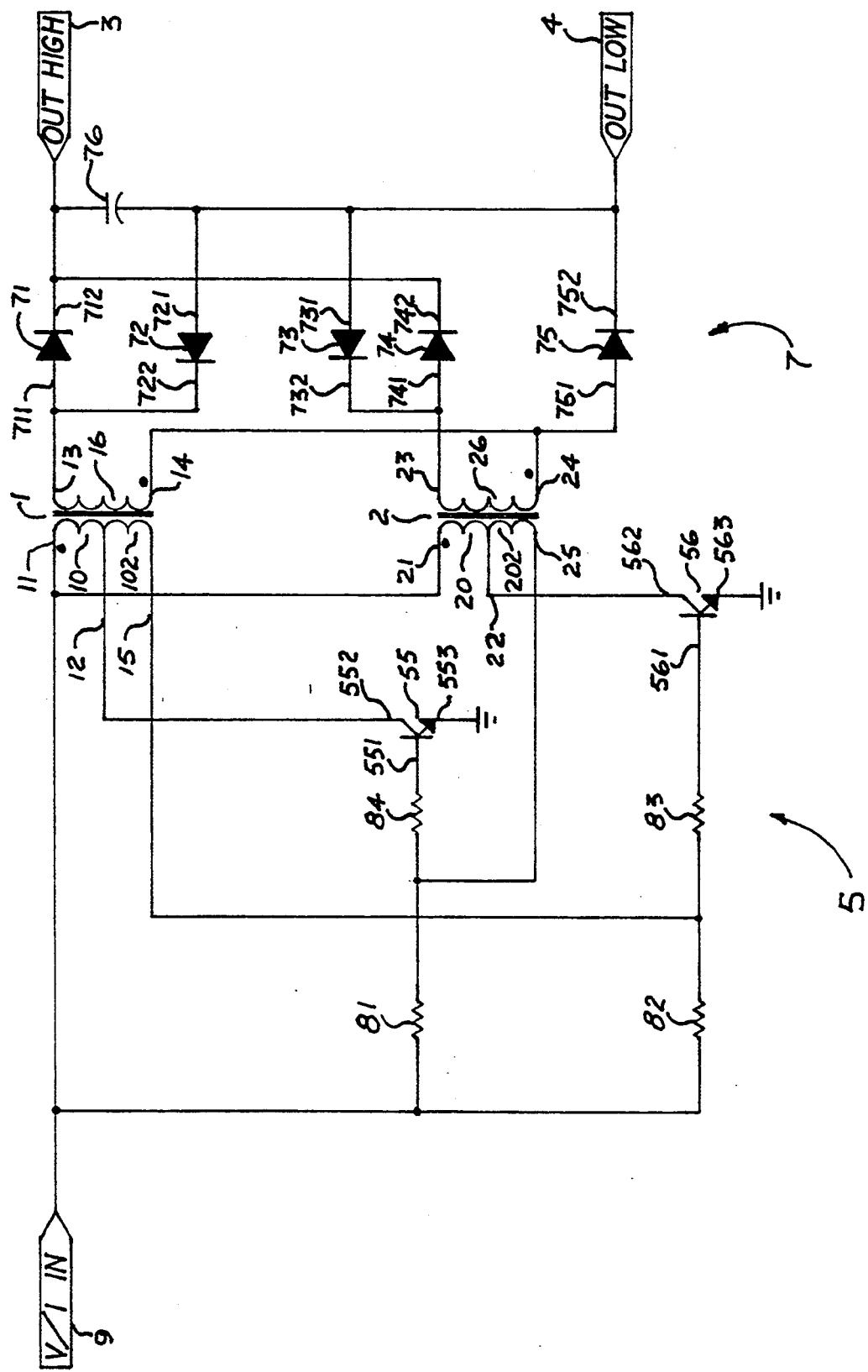
FIG. 3 is a schematic of an alternative embodiment of the present invention, containing a self-biasing feature.

A system constructed according to the invention, isolates an input of constant or varying DC signals with two transformers 1 and 2 shown in FIG. 1. The output of the isolator, measured across OUT HIGH 3 and OUT LOW 4 is galvanically isolated from the input signal 9, but has the same electrical characteristics as the input signal 9. Thus, it is possible to accurately reproduce information carrying variations on a DC power line. If desired, the circuit can also be implemented in a self-biasing fashion as depicted in FIG. 3.

FIG. 1 illustrates a system according to the invention in block diagram form. A signal 9 is input to two transformers, 1 and 2. An oscillator 5 alternatively activates the transformers to create a 180° phase relationship between them. As discussed further herein, the alternating collapsing magnetic fields of the transformers can be used to supply power to oscillators 5. The outputs of the transformers are provided to a rectifier circuit 7. The signal across the two outputs of the rectifier circuit 3 and 4 has the same electrical characteristics as the input signal 9.

Figure 2:
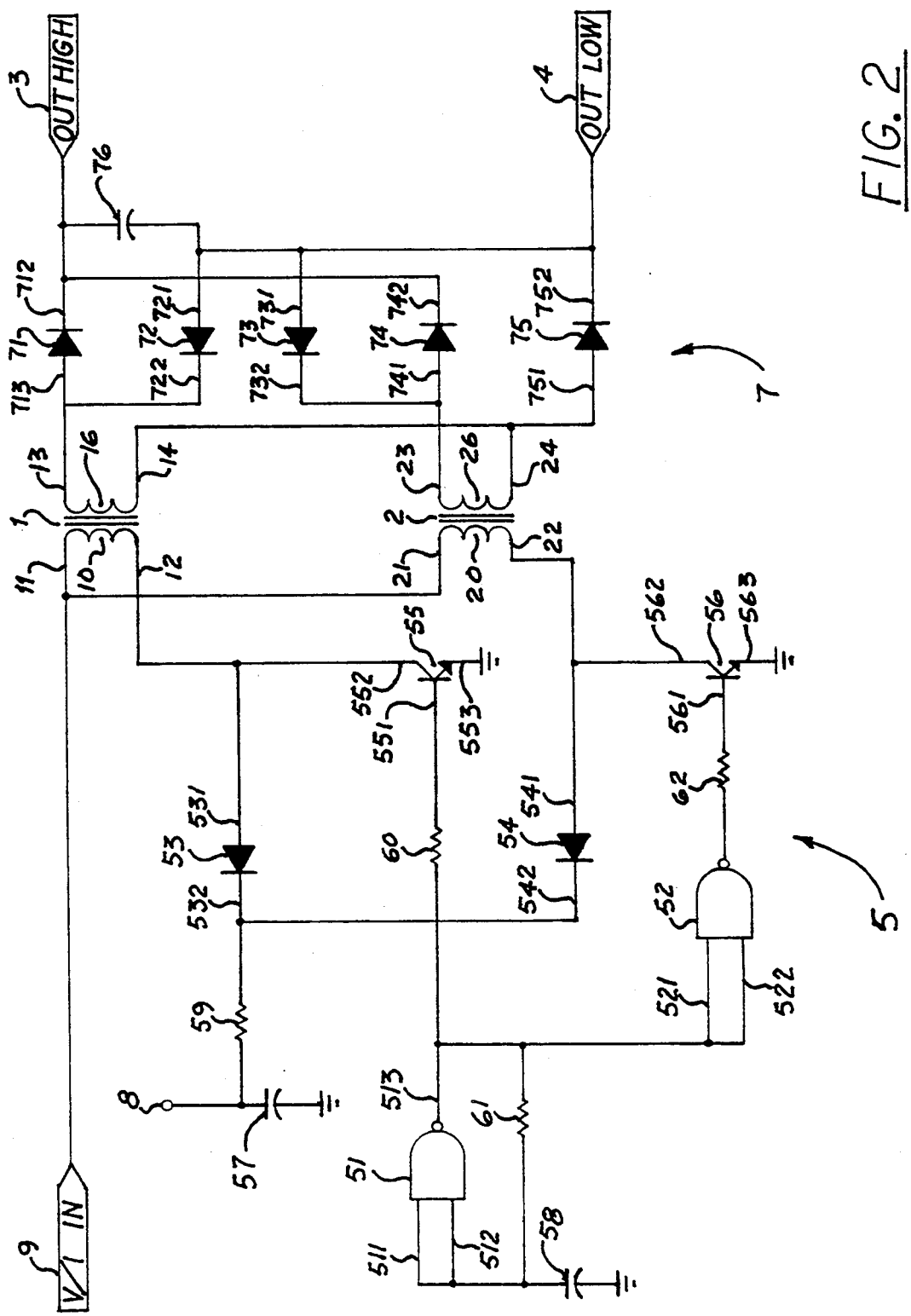
FIG. 2 is a schematic drawing of one embodiment of the invention.

By way of example as shown in FIG. 2, the oscillator circuit 5 includes two NAND gates 51 and 52, two diodes 53 and 54, two NPN transistors 55 and 56, two capacitors 57 and 58, and four resistors 59, 60, 61, and 62.

Resistor 61 is connected between the output 513 of NAND gate 51 and the junction of both inputs 511 and 512 of NAND gate 51. Capacitor 58 is connected between ground and the junction of the two inputs 511 and 512 of NAND gate 51.

Output 513 of NAND gate 51 is connected to both inputs 521 and 522 of NAND gate 52. The output 523 of NAND gate 52 is connected, via resistor 62 to the base 561 of transistor 56. The emitter 563 of transistor 56 is connected to ground. The collector 562 of transistor 56 is connected to the second tap 22 of the primary winding of transformer 2. Collector 562 and the second tap 22 of the primary winding 20 of transformer 2 are also connected to the anode 541 of diode 54. The cathode 542 of diode 54 is connected to the cathode 532 of diode 53. Cathodes 532 and 542 are also connected, via resistor 59 to VCC 8. Capacitor 57 is between VCC 8 and ground.

Output 513 of NAND gate 51 is connected, via resistor 60, to the base 551 of transistor 55. The emitter 553 of transistor 55 is connected to ground. The collector 552 of transistor 55 is connected to the second tap 12 of the primary winding 10 of transformer 1. Collector 552 and second tap 12 of the primary winding 10 of the transformer 1 are also connected to the anode 531 of diode 53.

The rectifier circuit 7 includes five diodes, 71, 72, 73, 74, and 75, and one capacitor 76. The first tap 13 of the secondary winding 16 of transformer 1 is connected to the anode 711 of diode 71 and the cathode 722 of the diode 72. The second tap 14 of the secondary winding 16 of transformer 1 and the second tap 24 of transformer 2 are both connected to the anode 751 of diode 75. The first tap 23 of the secondary winding 26 of transformer 2 is connected to the cathode 732 of diode 73 and the anode 741 of diode 74.

The cathode 712 of diode 71 is connected to the cathode 742 of diode 74 and to OUT HIGH 3. Capacitor 76 is connected between OUT HIGH 3 and OUT LOW 4. OUT LOW 4 is connected to the anode 721 of diode 72, the anode 731 of diode 73, and the cathode 752 of diode 75.

An alternative configuration using a third winding in each transformer for self biasing of transistors 55 and 56 is depicted in FIG. 3. In this configuration transformers 1 and 2 each have three windings formed in any known manner with corresponding taps 15 and 25. As illustrated transformer 1 has two primary windings 10 and 102 and secondary winding 16. Transformer 2 has two primary windings 20 and 202 and secondary winding 26. The connections to windings 10 and 20 are made from taps 12 and 22 to the collectors 552 and 562 of transistors 55 and 56, respectively, as previously described with respect to FIG. 2. In transformer 1 third winding 102, the second primary winding, is connected between taps 12 and 15. Tap 15 is connected between resistors 82 and 83 to bias transistor 56. Similarly, in transformer 2, third winding 202 (the second primary winding) is connected between taps 22 and 25. Tap 25 is connected between resistors 81 and 84 to bias transistor 56. Thus, in this embodiment self biasing is achieved because the third windings 102 and 202 are used to alternatively turn on transistors 55 and 56. The oscillation circuit therefore includes the transformers 1 and 2, the transistors 55 and 56, and four resistors 81, 82, 83, and 84. It should be noted that, since the bias for the transistors 55 and 56 is derived from forward conduction of the transformers 1 and 2, this embodiment may be more likely to have errors in the output. This may be a consideration in implementing this circuit configuration in applications where the input signal is a varying DC level signal carrying information.

As FIG. 3 illustrates, in this embodiment the input signal 9 is connected to taps 11 and 21 of first primary windings 10 and 20 of transformers 1 and 2, respectively. Resistor 82 is connected between the input signal 9 and tap 15 of the second primary winding 102 of transformer 1. Resistor 81 is connected between the input signal and tap 25 of the second primary winding 202 of transformer 2. Resistor 83 is connected between tap 15 of the second primary winding 102 of transformer 1 and the base 561 of transistor 56. Resistor 84 is connected between tap 25 the second primary winding 22 of transformer 2 and the base 551 of transistor 55. Taps 12 and 22 of transformers 1 and 2 are connected to the collectors 552 and 562 of transistors 55 and 56 respectively. Emitters 553 and 563 of transistors 55 and 56 are connected to ground.

Figure 4:
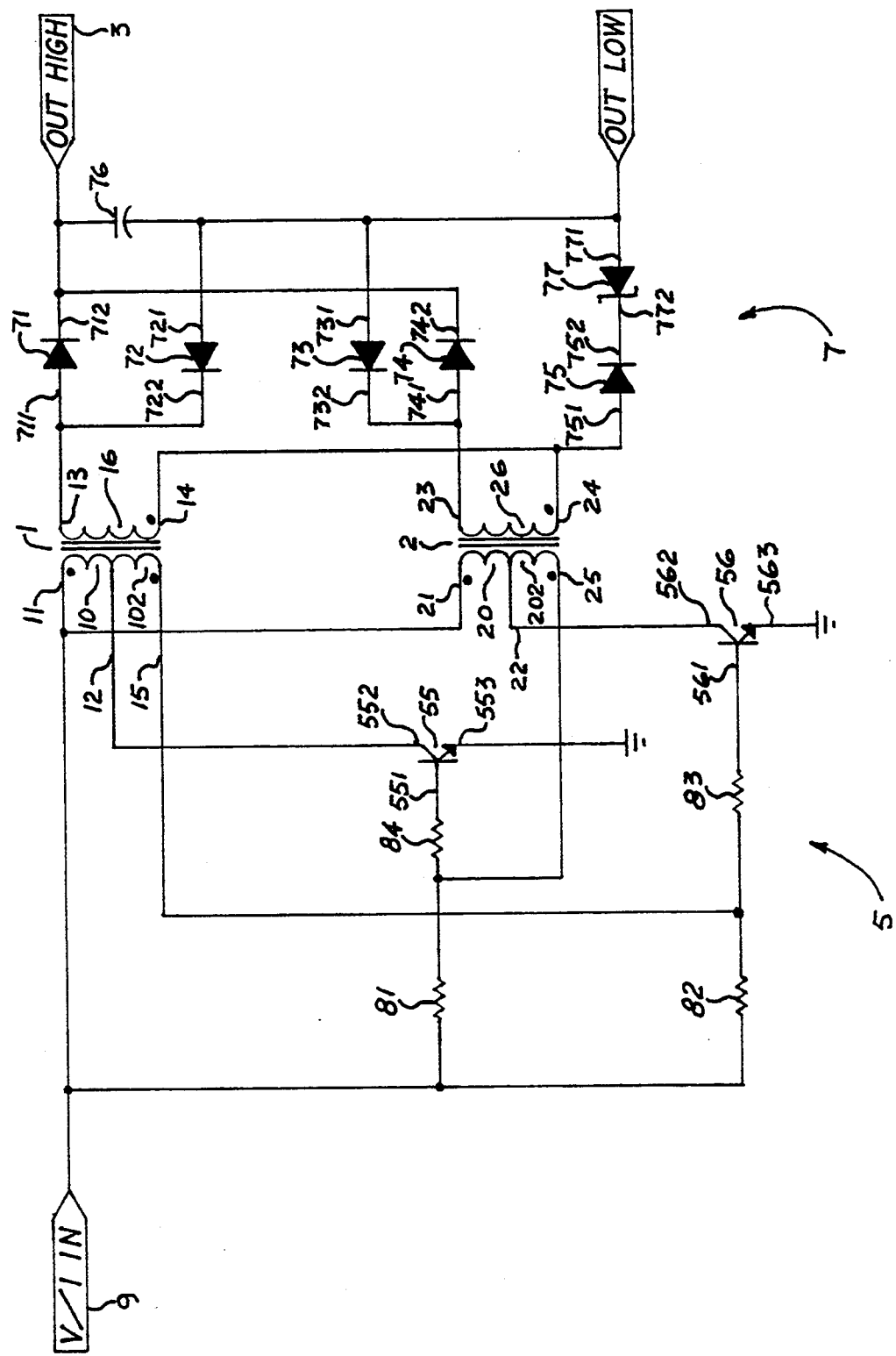
FIG. 4 is a schematic of still another alternative embodiment of the invention.

Either of the above configurations shown in FIGS. 2 and 3 can be further modified, for example, as shown in FIG. 4, by connecting the cathode 772 of zener diode 77 to the cathode 752 of diode 75, and connecting the anode 771 of zener diode 77 to OUT LOW 4. This modification will allow for the gain of oscillation voltage as the collapsing field of transformer 1 or 2 causes the current to flow at the same rate as the inducted current, thereby producing a voltage equal to the product of the transformer current and the primary and secondary load resistance.

Operationally, using the configuration depicted in FIG. 2 as an example, when the output 513 of NAND gate 51 is high, transistor 55 will be turned on by the signal to its base 551. At the same time, NAND gate 52 will invert the output of 51, providing a low signal to the base 561 of transistor 56, causing transistor 56 to be off. The output 513 of NAND gate 51 is fed back into its inputs 511 and 512, through resistor 61 to charge capacitor 58. This causes the state of output 513 to oscillate at a period calculated from the time constant of the charging circuit resistor 61, capacitor 58 and NAND gate 51. When capacitor 58 charges to a voltage sufficient to reach a logical high on inputs 511 and 512, NAND gate 51 changes state to produce a logical low on output 513. Capacitor 58 discharges through resistor 61 and the output circuit of NAND gate 51. When the voltage on capacitor 58 is sufficiently low, NAND gate 51 produces a logical high on output 513 and the process repeats. As NAND gate output 513 oscillates between high and low states, gate output 523 oscillates out of phase with gate output 513. The result is that transistors 55 and 56 are alternatively turned ON and OFF by the signals at their respective bases 551 and 561.

As the transistors 55 and 56 alternate between ON and OFF states, the primary windings 10 and 20 see the transistors as alternating short and open circuits (short circuit when the transistor is ON and the input signal to the collector is therefore connected to ground through the emitter, open circuit when the transistor is OFF).

The magnetic fields of transformers 1 and 2 vary based on the state of the transistor connected to their primary windings. As the field of each transformer collapses, it has an effect on the secondary of that transformer. The voltage inducted on the secondary of the nonconducting transformer is summed into the output voltage of the conducting transformer. As discussed below, this adds a bias voltage to cancel the forward voltage drop of the output rectification diodes in rectifier 7.

In FIG. 2 the current path of the output can be described as follows. Assuming transformer 1 is the driven transformer, there is a forward voltage drop at diode 71. The voltage is then applied at capacitor 76. Next, there is a drop across diode 73. The return path then involves transformer 2 prior to reaching the return side of transformer 1 at the common node of transformers 1 and 2. Transformer 2 is conducting in the reverse direction causing a current to flow through diode 75 and diode 73. As a result, a two diode drop voltage appears across transformer 2. Since transformer 2 is in the conduction path for the output, this two diode drop voltage is added to the output voltage, thereby canceling the effects of the rectification diodes 71 and 73.

Similarly, when transformer 2 is conducting, diodes 72 and 74 are the rectification diodes, while transformer 1 and diodes 72 and 75 form the cancellation circuitry.

The circuit according to the invention, also provides its own power supply for the oscillation circuit. As previously discussed, the embodiment in FIG. 3 provides self biasing for transistors 55 and 56. The oscillation rate would be a function of the values chosen for the resistors and the inductance of the primary windings in transformers 1 and 2. In the embodiment in FIG. 2, supply voltage $V_{cc}$ (8 in FIG. 2), resulting from the collapsing field of one of the transformers, is provided to the oscillator circuit 5 via diodes 53 and 54. For example, when transistor 55 is conducting (ON), transistor 56 will be off. The field on transformer 2 will be collapsing, forcing current to continue to flow through transformer 1. Since transistor 56 is not conducting, the voltage at anode 541 of diode 54 will continue to rise until diode 54 conducts. This current is then dumped into capacitor 57 which is used as a filter and a charge holder. The oscillator circuit will change states forcing transistor 56 to conduct and transistor 55 to be off. This causes diode 53 to conduct and supply a charge to capacitor 57 in the manner described above.

FIG. 4 shows still another embodiment incorporating one possible modification to the design of the rectifier 7, while retaining the basic operation of the invention. This modification is depicted as a modification to the embodiment of FIG. 3 only by way of example. In FIG. 4, to gain oscillation voltage diode 75 of FIG. 3 is replaced by a zener diode 77 and a diode 175, which may be the same as diode 75 in FIG. 3 or a different diode as required. As described earlier, the collapsing field of one of the transformers, 1 or 2, will cause the current in that transformer to flow at the same rate as the inducted current. This current will produce a voltage $V = I*R$, where I is the transformer current and R is the primary and secondary load resistance. The primary load R is basically resistor 84 for the embodiment depicted in FIG. 3. The secondary load for transformer 1 is diode 73 in series with diode 75. The peak voltage induced by transformer 1 is therefore two diode drops. This then limits $V_{cc}$ to $V_{in}$ 9 plus one diode drop (one diode drop is lost by diode 72) or a minimum of 1.8 volts. By replacing diode 75 in FIG. 3 with a zener 77 and a blocking diode 175, which is a bias circuit as shown in FIG. 4, the supply voltage $V_{cc}$ can be raised. The load current for the collapsing field is now imposed across a zener diode 77 and diode 175. The output voltage is not affected since zener diode 77 is a common part of the cancellation circuit and will simply raise OUT HIGH 3 to a higher point relative to the common point of transformers 1 and 2.

While a preferred embodiment of the invention has been described, it will be understood that it is capable of further modifications, and that this application is intended to cover any variations, uses, or adaptations of the invention, following, in general, the principles of the invention and including such departures from the present disclosure as to come within the knowledge or customary practice in the art to which the invention pertains and as may be applied to the essential features hereinbefore set forth and falling within the scope of the invention or the limits of the appended claims.

What is claimed is:

1. A signal isolation apparatus comprising:
   a first transformer having a primary winding tap receiving an input signal and another primary winding tap receiving a first oscillating signal;
   a second transformer having a primary winding tap receiving said input signal and another primary winding tap receiving a second oscillating signal, said second oscillating signal being out of phase with said first oscillating signal;
   a rectifier electrically connected between a first secondary winding tap of said first transformer and a first secondary winding tap of said second transformer, said rectifier having a high output terminal and a low output terminal, said low output terminal being referenced to secondary windings of said first and second transformers, wherein a signal across said high and low output terminals is an output signal galvanically isolated from said input signal and having essentially the same electrical characteristics as said input signal, wherein said rectifier comprises a diode bridge and a capacitance between said high and low outputs, said diode bridge comprising a first diode having an anode connected to said first secondary winding tap of said first transformer and a cathode connected to said high output, a second diode having an anode connected to said first secondary winding tab of said second transformer and a cathode connected to said high output, a third diode having a cathode connected to said first secondary winding tap of said second transformer and an anode connected to said low output, a fourth diode having a cathode connected to said secondary winding tap of said transformer and an anode connected to said low output and a fifth diode having an anode connected to said second secondary windings of said first and second transformers and a cathode connected to said low output.

2. The signal isolation apparatus recited in claim 1 wherein said rectifier further comprises a bias circuit connected between a common junction of said second secondary winding taps of said first and second transformers and said low output terminal of said rectifier.

3. The signal isolation apparatus recited in claim 1, wherein said first and second oscillating signals are 180 degrees out of phase.

4. The signal isolation apparatus recited in claim 2, wherein said first and second oscillating signals are 180 degrees out of phase.

5. The signal isolation apparatus recited in claim 3, further comprising an oscillator coupled to said primary winding tap of said first transformer and said another primary winding tap of said second primary transformer.

6. The signal isolation apparatus recited in claim 5, further comprising a phase shifter receiving an input signal from said oscillator, said phase shifter having an output signal 180 degrees out of phase with said input signal of said oscillator.

7. The signal isolation apparatus recited in claim 5, wherein said oscillator comprises a first logic gate with a first logic gate output connected to an input of said first logic gate through a time delay circuit to produce said first oscillating signal at said first logic gate output.

8. The apparatus recited in claim 7 wherein said first logic gate output is further connected to a phase shifter comprising an inverter to produce said second oscillating signal at an output of said inverter.

9. The apparatus recited in claim 1 wherein said input signal is a DC level.

10. The apparatus recited in claim 1 wherein said input signal is an information carrying power signal.

11. The apparatus recited in claim 10 wherein said information carrying power signal comprises a varying DC level, said DC level varying according to said information.

12. A signal isolation apparatus comprising:
    an oscillator;

a first transformer having a primary winding tap receiving an input signal and another primary winding tap receiving a first oscillating signal;

a second transformer having a primary winding tap receiving said input signal and another primary winding tap receiving a second oscillating signal, said second oscillating signal being out of phase with said first oscillating signal, wherein said first and second oscillating signals are 180 degrees out of phase; and a rectifier electrically connected between a first secondary winding tap of said first transformer and a first secondary winding tap of said second transformer, said rectifier having a high floating output terminal and a low floating output terminal, said low floating output terminal being referenced to second secondary windings of said first and second transformers, wherein a signal across said high and low floating output terminals is an floating output signal galvanically isolated from said input signal and having essentially the same electrical characteristics as said input signal;

wherein said oscillator drives a first switch to produce said first oscillating signal, and a second switch through a phase shifter to produce said second oscillating signal.

13. The signal isolation apparatus recited in claim 12, wherein said rectifier comprises a diode bridge and a capacitor between said high and low floating outputs, and wherein said diode bridge comprises a first diode having an anode connected to said first secondary winding tap of said first transformer and a cathode connected to said high floating output, a second diode having an anode connected to said first secondary winding tap of said second transformer and a cathode connected to said high floating output, a third diode having a cathode connected to said first secondary winding tap of said first transformer and an anode connected to said low floating output, a fourth diode having a cathode connected to said first secondary winding tap of said second transformer and an anode connected to said low floating output, and a fifth diode having an anode connected to said secondary windings of said first and second tranformers and a cathode connected to said low floating output.

14. The signal isolation apparatus as recited in claim 12, wherein said first logic gate output is further connected to a phase shifter comprising an inverter to produce said second oscillating signal at an output of said inverter.

15. The signal isolation apparatus as recited in claim 12, wherein said rectifier further comprises a bias circuit connected between a common junction of said second secondary winding taps of said first and second transformers and said low floating output terminal of said rectifier.

16. A method of signal isolation, the method comprising the steps of:

supplying an input signal to a primary winding of a first transformer and a first oscillating signal to another primary winding tap of said first transformer, wherein said first oscillating signal is provided by a first switch driven by an oscillator to produce said first oscillating signal;

supplying said input signal to a primary winding of a second transformer and a second oscillating signal to another primary winding tap of said second transformer, said second oscillating signal being out of phase with said first oscillating signal, wherein said second oscillating signal is provided by a second switch driven by a phase shifter coupled to said oscillator to produce said second oscillating signal;

obtaining an floating output signal across high floating and low floating output terminals of a rectifier, said rectifier being electrically connected between a first secondary winding tap of said first transformer and a first secondary winding tap of said second transformer, said rectifier having said high floating output terminal and said low floating output terminal, said low floating output terminal being referenced to a second secondary winding tap of said first and second transformers, said floating output signal being galvanically isolated from said input signal and having essentially the same electrical characteristics as said input signal.

17. The method recited in claim 16 further comprising supplying said first and second oscillating signals 180 degrees out of phase.

* * * * *